United States Patent
Lee et al.

(10) Patent No.: US 7,315,045 B2
(45) Date of Patent: Jan. 1, 2008

(54) SAPPHIRE/GALLIUM NITRIDE LAMINATE HAVING REDUCED BENDING DEFORMATION

(75) Inventors: Chang Ho Lee, Suwon-si (KR); Hae Yong Lee, Kwangmyeong-si (KR); Choon Kon Kim, Suwon-si (KR)

(73) Assignee: Samsung Corning Co., Ltd. (KR)

( * ) Notice: Subject to any disclaimer, the term of this patent is extended or adjusted under 35 U.S.C. 154(b) by 0 days.

(21) Appl. No.: 11/045,688

(22) Filed: Jan. 28, 2005

(65) Prior Publication Data

US 2005/0167683 A1 Aug. 4, 2005

(30) Foreign Application Priority Data

Jan. 29, 2004 (KR) .................. 10-2004-0005585

(51) Int. Cl.
*H01L 27/15* (2006.01)
*H01L 31/12* (2006.01)
*H01L 33/00* (2006.01)

(52) U.S. Cl. .................. 257/79; 257/631; 257/E33.001; 257/E33.034

(58) Field of Classification Search .................. 257/11, 257/79, 631, E33.001, E33.034
See application file for complete search history.

(56) References Cited

U.S. PATENT DOCUMENTS

| 6,528,394 | B1 | 3/2003 | Lee |
| 6,824,610 | B2 * | 11/2004 | Shibata et al. ................. 117/89 |
| 6,829,270 | B2 * | 12/2004 | Suzuki et al. ............. 372/43.01 |

\* cited by examiner

*Primary Examiner*—Hoai Pham
(74) *Attorney, Agent, or Firm*—Anderson Kill & Olick, PC

(57) ABSTRACT

The present invention relates to a sapphire/gallium nitride laminate, wherein a curvature radius thereof is positioned on the right side of a first curve plotted from the following functional formula (I):

$$Y = Y_0 + A \cdot e^{-(x-1)/T} \quad (I)$$

wherein Y is the curvature radius (m) of a sapphire/gallium nitride laminate, X is the thickness (μm) of a gallium nitride film, $Y_0$ is 5.47±0.34, A is 24.13±0.50, and T is 0.56±0.04. The inventive laminate can be advantageously used in the manufacture of a high quality electronic device.

11 Claims, 3 Drawing Sheets

(a)      (b)

(a)    (b)

SAPPHIRE/GALLIUM NITRIDE LAMINATE HAVING REDUCED BENDING DEFORMATION

FIELD OF THE INVENTION

The present invention relates to a sapphire/gallium nitride laminate for an electronic device, which has reduced bending deformation.

BACKGROUND OF THE INVENTION

A sapphire/gallium nitride laminate, which is useful for a light emitting device (eg., LED, LD) or other electronic devices as a substrate, has been conventionally prepared by growing gallium nitride on a sapphire substrate using metal organic chemical vapor deposition (MOCVD), hydride vapor phase epitaxy (HVPE), etc. The sapphire/gallium nitride laminate suffers from bending deformation due to interfacial strain caused by the differences in the lattice parameter and thermal expansion coefficient between sapphire and gallium nitride. The degree of the bending deformation increases as the thickness of a gallium nitride (GaN) film increases, as can be seen in FIG. 1. Such bending deformation adversely affects the quality and productivity of an electronic device comprising the laminate as a substrate.

U.S. Pat. No. 6,528,394 discloses a method for growing gallium nitride having an interface layer with an embossed shape between a GaN film and a sapphire substrate by carrying out a first nitridation, a surface-treatment with ammonia ($NH_3$) and hydrogen chloride (HCl) and a second nitridation, in succession, to form an aluminum nitride (AlN) interface layer, before the growth of gallium nitride.

On studying a sapphire/gallium nitride laminate having a reduced bending deformation and a sufficiently thick gallium nitride layer, the present inventors have found that the bending deformation can be further reduced by controlling the number and size of the embossings formed on an AlN interface layer between the GaN film and the sapphire substrate.

SUMMARY OF THE INVENTION

It is, therefore, an object of the present invention to provide a sapphire/gallium nitride laminate having reduced bending deformation for an electronic device.

In accordance with the present invention, there is provided a sapphire/gallium nitride laminate, wherein a curvature radius thereof is positioned on the right side of a first curve plotted from the following functional formula (I):

$$Y = Y_0 + A \cdot e^{-(X-1)/T} \quad (I)$$

wherein

Y is the curvature radius (m) of a sapphire/gallium nitride laminate,

X is the thickness (μm) of a gallium nitride film, $Y_0$ is 5.47±0.34,

A is 24.13±0.50, and

T is 0.56±0.04.

BRIEF DESCRIPTION OF THE DRAWINGS

The above and other objects and features of the present invention will become apparent from the following description of the invention, when taken in conjunction with the accompanying drawings, which respectively show.

DETAILED DESCRIPTION OF THE INVENTION

The functional relation between the curvature radius and the gallium nitride thickness is defined by formula (I).

Figure 6:
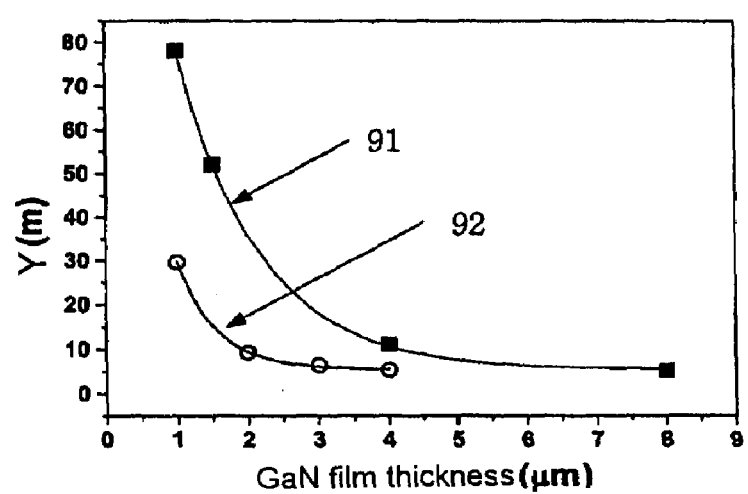
FIG. 6: graphs of the curvature radius value to the GaN film thickness for the sapphire/gallium nitride laminate obtained in Example 1 (Curve 91) and the laminate obtained in Comparative Example 1 (Curve 92).

The curvature radius for the inventive sapphire/gallium nitride laminate is positioned on the right side of the Curve 92 in FIG. 6 for formula (I) wherein $Y_0$ is 5.47±0.34, A is 24.13±0.50 and T is 0.56±0.04, and preferably, it matches or positioned on the left side of the Curve 91 wherein $Y_0$ is 5.44±0.55, A is 72.52±0.74 and T is 1.15±0.04.

Figure 1:
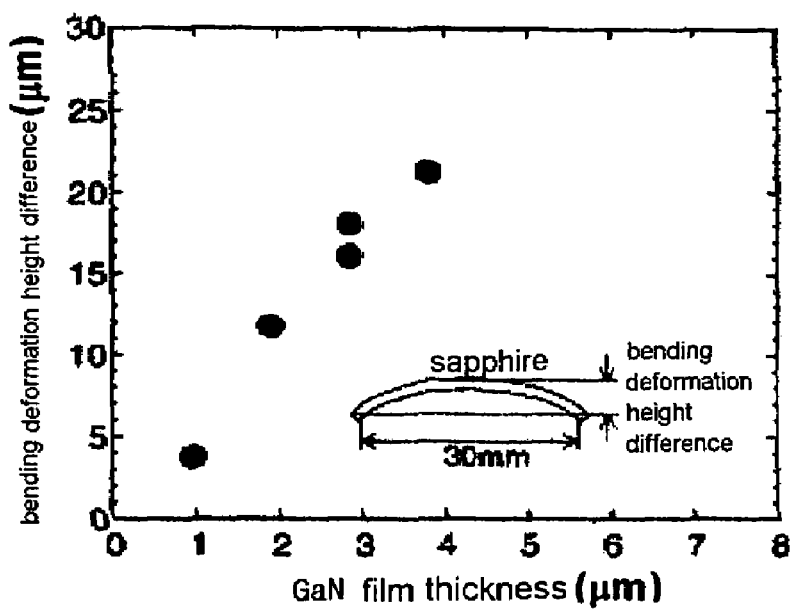
FIG. 1: a graph showing the change in the bending deformation depending on the thickness of the gallium nitride layer in the prior sapphire/gallium nitride laminate.
Figure 2:
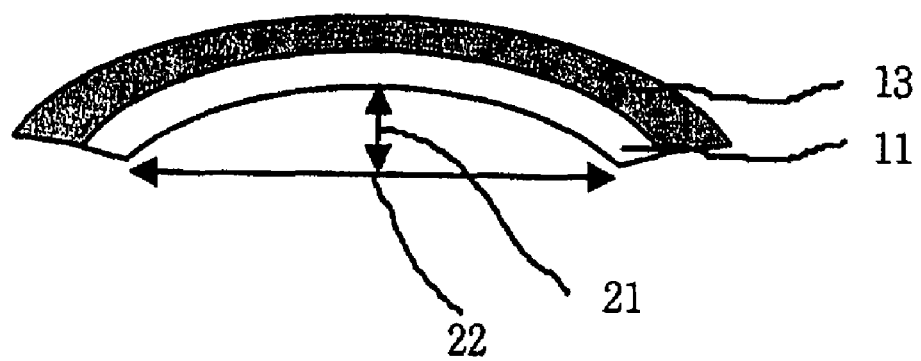
FIG. 2: a schematic view for showing the parameters required for measuring the curvature radius of a sapphire/gallium nitride laminate.

In accordance with the present invention, the curvature radius (Y) for evaluating the degree of bending deformation of a sapphire/gallium nitride laminate can be calculated by formula (II) using the parameters measured as shown in FIG. 2:

$$Y = D^2/8\Delta H \quad (II)$$

wherein D is the distance (22) between two ends of a deformed substrate, i.e., a laminate of sapphire (11) and a GaN film (13), and ΔH is the height difference (21) of the deformed substrate measured at the center thereof.

Figure 3:
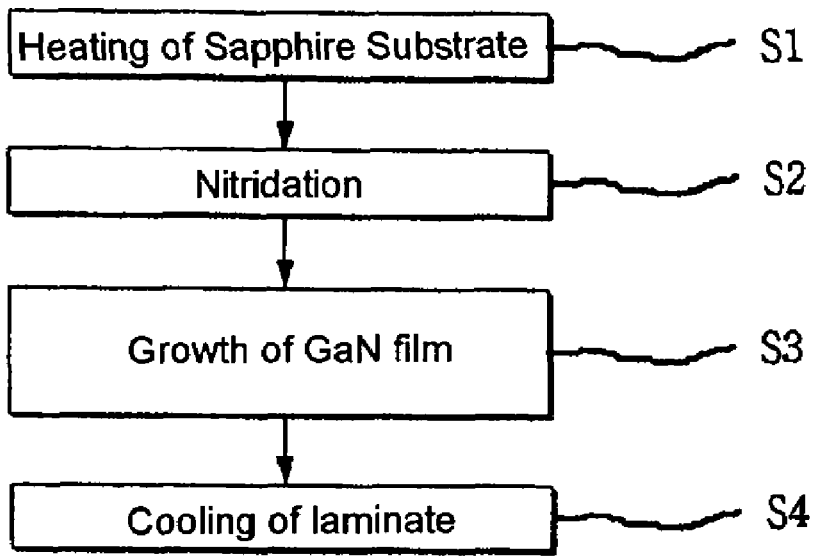
FIG. 3: a schematic flow diagram of a procedure for obtaining the inventive sapphire/gallium nitride laminate.

The inventive sapphire/gallium nitride laminate may be obtained by using a procedure as schematically shown in FIG. 3, which comprises heating a sapphire substrate (S1), nitridating the heated substrate (S2), growing a GaN film on the nitridated substrate (S3) and cooling the resulting laminate (S4).

Specifically, in step S1, the sapphire substrate is heated to a temperature ranging from 800 to 1050° C.

Then, the nitridation procedure in step S2 may be conducted by a method as disclosed in U.S. Pat. No. 6,528,394, which is incorporated by reference in its entirety, wherein the sapphire substrate is firstly nitridated using a gaseous ammonia ($NH_3$) to form an AlN layer on the substrate, the nitridated substrate is treated with an $NH_3$—hydrogen chloride (HCl) gas mixture to etch the AlN layer partially, and then the surface-treated substrate is further nitridated to form hexagonal-like circular embossings in the AlN layer.

In accordance with the present invention, in step S2, the mix ratio of HCl and $NH_3$ to be introduced in the AlN layer-formation step is adjusted in the range of 1:10 to 1:20 by volume so as to control the number and size of embossings to be formed in the AlN layer, thereby minimizing stress at the interface between the sapphire substrate and the GaN film to be deposited thereon later. It is preferred that the AlN layer has embossings with a height of 150 nm or less and a traverse width of 10 to 100 nm in a density of 25 to 500 Ea/μm².

In step S3, the GaN film may be grown to a few μm thickness on the AlN-formed substrate using a conventional MOCVD or HVPE method. The growth temperature may be in the range of above 900° C. In the present invention, it is preferred that the GaN film has a thickness of 0.5 to 20 μm, preferably about 10 μm. In some cases, the GaN film may be grown to a greater thickness of 80 to 200 μm, preferably 80 μm. Such a thick GaN film may be removed to be used as a freestanding substate or seed substrate for the regrowth of a GaN single crystal.

In step S4, the laminate is cooled to an ambient temperature.

Figure 4:
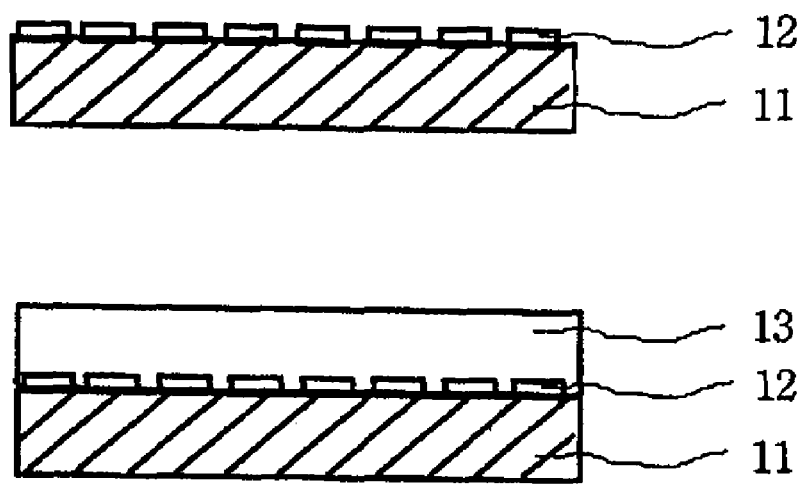
FIG. 4: a schematic diagram of a procedure for forming an AlN interface layer between a GaN film and a sapphire substrate in an embossed shape.

FIG. 4 shows the procedures for forming AlN interface layer (12) between sapphire substrate (11) and GaN film (13) in an embossed shape before the growth of GaN according to the steps S2 and S3.

Figure 5:
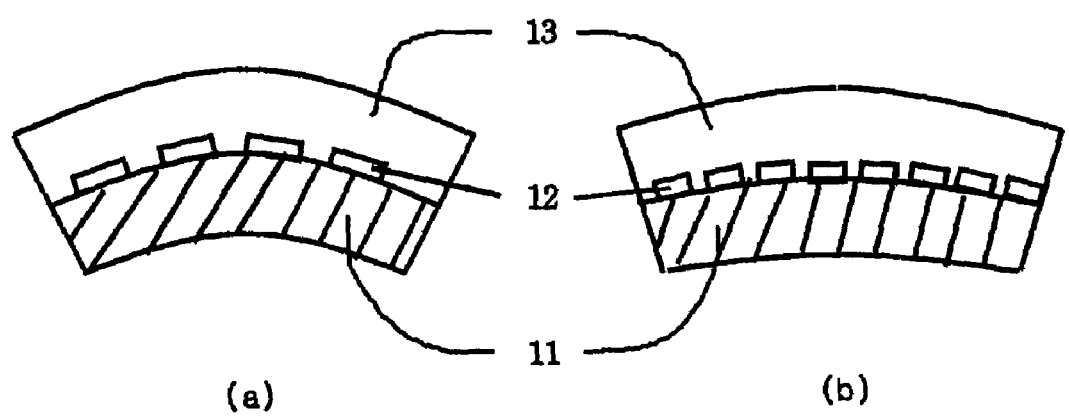
FIG. 5: a schematic diagram for showing the difference in the degree of bending deformation depending on the number of embossings present in an AlN interface layer.

As mentioned previously, the inventive sapphire/gallium nitride laminate exhibits reduced bending deformation due to minimized stress at the interface between the sapphire substrate and the GaN film, which is obtained from the control of the number and size of embossings formed in the AlN interface layer. FIG. 5 illustrates that bending deformation of the laminate having properly controlled embossings in the AlN interface layer is remarkably reduced.

The following Example and Comparative Example are given for the purpose of illustration only, and are not intended to limit the scope of the invention.

EXAMPLE

A sapphire substrate of 2 inch diameter was heated and nitridated by treating successively with gaseous ammonia, a gas mixture of hydrogen chloride (HCl) and ammonia (NH₃) and gaseous ammonia, according to a method disclosed in U.S. Pat. No. 6,528,394 before the growth of a GaN film, to obtain a sapphire/gallium nitride laminate having AlN interface layer in an embossed shape. At this time, the mix ratio of a gas mixture of hydrogen chloride (HCl) and ammonia used for forming embossings in the AlN layer was varied to 1:12, 1:13, 1:15 and 1:17 by volume, while the thickness of the GaN film was varied to 1, 1.5, 4 and 8 μm.

The distance (D) between two ends of the substrate and the height difference (ΔH) of the sapphire substrate as shown in FIG. 2 were measured, and the measurements were used to calculate the curvature radius with formula (II). The results are shown in Table 1.

TABLE 1

| Embossings in AlN interface layer | | | | Curvature radius (m) to GaN thickness (μm) | | | |
|---|---|---|---|---|---|---|---|
| HCl:NH₃ (v/v) | Height (nm) | Traverse Width (nm) | Density (Ea/μm²) | 1 μm GaN | 1.5 μm GaN | 4 μm GaN | 8 μm GaN |
| 1:12 | 90~110 | 10~20 | 250~300 | 78.1 | 52.1 | 11.2 | 5.3 |
| 1:13 | 90~110 | 40~50 | 180~200 | — | — | 9.8 | 4.3 |
| 1:15 | 90~110 | 70~80 | 80~100 | — | — | 8.2 | 3.8 |
| 1:17 | 90~110 | 90~100 | 25 | — | — | 7.1 | 3.5 |

As can be seen in Table 1, the curvature radius of the laminate increases (i.e., bending deformation is reduced) as the flow rate of HCl increases and the sizes and/or number of the embossings are controlled.

Comparative Example

A GaN film was grown on the surface of a sapphire substrate using a conventional MOCVD method without forming an AlN interface layer, to obtain a sapphire/gallium nitride laminate. At this time, the thickness of the GaN film was varied to 1, 2, 3 and 4 μm.

The results of the curvature radius for the laminate thus obtained are shown in Table 2.

TABLE 2

| GaN thickness (μm) | Curvature radius (m) |
|---|---|
| 1 | 29.6 |
| 2 | 9.4 |
| 3 | 6.5 |
| 4 | 5.4 |

From the comparison of Tables 1 and 2, it can be seen that at the same GaN thickness, the curvature radius of the laminate obtained from Example is at least 2 folds longer than that of the laminate obtained from Comparative Example.

FIG. 6 shows graphs plotting the curvature radius value in relation to the GaN film thickness for the sapphire/gallium nitride laminate obtained in Example wherein the HCl—NH₃ mix ratio is 1:12 (Curve 91) and the laminate obtained in Comparative Example (Curve 92). Curve 91 is a plot of formula (I) wherein $Y_0$ is 5.44±0.55, A is 72.52±0.74 and T is 1.15±0.04, and Curve 92 is a plot of formula (I) wherein $Y_0$ is 5.47±0.34, A is 24.13±0.50 and T is 0.56±0.04. That is, the inventive laminate has remarkably reduced bending deformation, as compared to the prior laminate.

While the invention has been described with respect to the above specific embodiments, it should be recognized that various modifications and changes may be made to the invention by those skilled in the art which also fall within the scope of the invention as defined by the appended claims.

What is claimed is:

1. A sapphire/gallium nitride laminate comprising an embossed aluminum nitride (AlN) interface layer disposed between a GaN film and a sapphire substrate, the embossing density being 25 to 500/μm², wherein said laminate is curved with a curvature radius which is positioned on the right side of a first curve plotted from the following functional formula (I):

$$Y = Y_0 + A \cdot e^{-(x-1)/T} \quad (I)$$

wherein
   Y is the curvature radius (m) of a sapphire/gallium nitride laminate,
   X is the thickness (μm) of a gallium nitride film,
   $Y_0$ is 5.47±0.34,
   A is 24.13±0.50, and
   T is 0.56±0.04.

2. The sapphire/gallium nitride laminate of claim 1, wherein the curvature radius thereof is positioned on the left side of a second curve plotted from the formula (I) when $Y_0$ is 5.44±0.55, A is 72.52±0.74 and T is 1.15±0.04.

3. The sapphire/gallium nitride laminate of claim 1, wherein the curvature radius thereof is positioned on a second curve plotted from the formula (I) when $Y_0$ is 5.44±0.55, A is 72.52±0.74 and T is 1.15±0.04.

4. The sapphire/gallium nitride laminate of claim 1, wherein the AlN interface layer is formed by treating the sapphire substrate successively with gaseous ammonia (NH3), a gas mixture of hydrogen chloride (HCl) and ammonia and gaseous ammonia.

5. The sapphire/gallium nitride laminate of claim 4, wherein a gas mixture of HCl and $NH_3$ has a mix ratio ranging 1:10 to 1:20 by volume.

6. The sapphire/gallium nitride laminate of claim 1, wherein the gallium nitride film has a thickness of 0.5 to 20 µm.

7. The sapphire/gallium nitride laminate of claim 1, wherein the gallium nitride film has a thickness of 80 to 200 µm.

8. An electronic device which comprises the sapphire/gallium nitride laminate of claim 1 as a substrate.

9. The electronic device of claim 8, which is a light emitting device.

10. A gallium nitride film separated from the sapphire/gallium nitride laminate of claim 1.

11. The gallium nitride film of claim 10, which has a thickness of 80 to 200 µm.

* * * * *